United States Patent
Kim (10) Patent No.: US 7,590,023 B2
(45) Date of Patent: Sep. 15, 2009

(54) SEMICONDUCTOR MEMORY DEVICE WITH INTERNAL VOLTAGE GENERATOR AND METHOD FOR DRIVING THE SAME

(75) Inventor: Kyung-Whan Kim, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 159 days.

(21) Appl. No.: 11/647,381

(22) Filed: Dec. 29, 2006

(65) Prior Publication Data

US 2008/0002490 A1 Jan. 3, 2008

(30) Foreign Application Priority Data

Jun. 30, 2006 (KR) .................. 10-2006-0061410

(51) Int. Cl.
G11C 5/14 (2006.01)
(52) U.S. Cl. .................. 365/226; 365/241; 365/229; 365/189.09; 365/201
(58) Field of Classification Search .............. 365/226, 365/241, 229, 189.09, 201
See application file for complete search history.

(56) References Cited

U.S. PATENT DOCUMENTS

| | | | |
|---|---|---|---|
| 6,130,829 A | 10/2000 | Shin | |
| 6,504,783 B2 | 1/2003 | Jo | |
| 6,535,447 B2 | 3/2003 | Kim et al. | |
| 6,980,448 B2 | 12/2005 | Foss et al. | |
| 7,016,248 B2 | 3/2006 | Park et al. | |
| 7,180,811 B2 * | 2/2007 | Lee | 365/226 |
| 2003/0046624 A1 * | 3/2003 | Muhtaroglu | 714/727 |
| 2006/0044889 A1 * | 3/2006 | Takahashi et al. | 365/189.11 |
| 2006/0179378 A1 * | 8/2006 | Iida et al. | 714/733 |

FOREIGN PATENT DOCUMENTS

| | | |
|---|---|---|
| JP | 2002-170387 | 6/2002 |
| JP | 2006-093692 | 4/2006 |
| KR | 10-2000-0003355 A | 1/2000 |
| KR | 10-2000-0065751 A | 11/2000 |
| KR | 10-2006-0040113 A | 5/2006 |

OTHER PUBLICATIONS

Korean Office Action issued in corresponding Korean Patent Application No. KR 10-2006-0061410, issued on Dec. 18, 2007.

* cited by examiner

*Primary Examiner*—Thong Q Le
(74) *Attorney, Agent, or Firm*—Mannava & Kang, P.C.

(57) ABSTRACT

A semiconductor memory device can stably supply a high voltage even if not only the PVT (Process, Voltage, and Temperature) fluctuations but also the level fluctuations of the external voltage are caused by the variation of the external environments. The driving force of a standby VPP generating unit and a plurality of active VPP generating units are changed according to the PVT fluctuations.

31 Claims, 7 Drawing Sheets

SEMICONDUCTOR MEMORY DEVICE WITH INTERNAL VOLTAGE GENERATOR AND METHOD FOR DRIVING THE SAME

CROSS-REFERENCE TO RELATED APPLICATIONS

The present invention claims priority of Korean patent application number 10-2006-0061410, filed on Jun. 30, 2006, which is incorporated by reference in its entirety.

BACKGROUND OF THE INVENTION

The present invention relates to semiconductor design technology; and, more particularly, to a semiconductor memory device capable of controlling a driving force of a high voltage in consideration of a PVT (Process, Voltage, Temperature) fluctuation.

Generally, a high voltage generator is an apparatus for supplying a constant level of a high voltage to a circuit in a chip which needs an increased voltage (hereinafter, referred to as 'VPP' higher than a power supply voltage (VDD or VCC). Particularly, the high voltage generator has been used for a word line driver, a bit line gating circuit and a data output buffer in the memory device such as a DRAM (Dynamic Random Access Memory).

Figure 1:
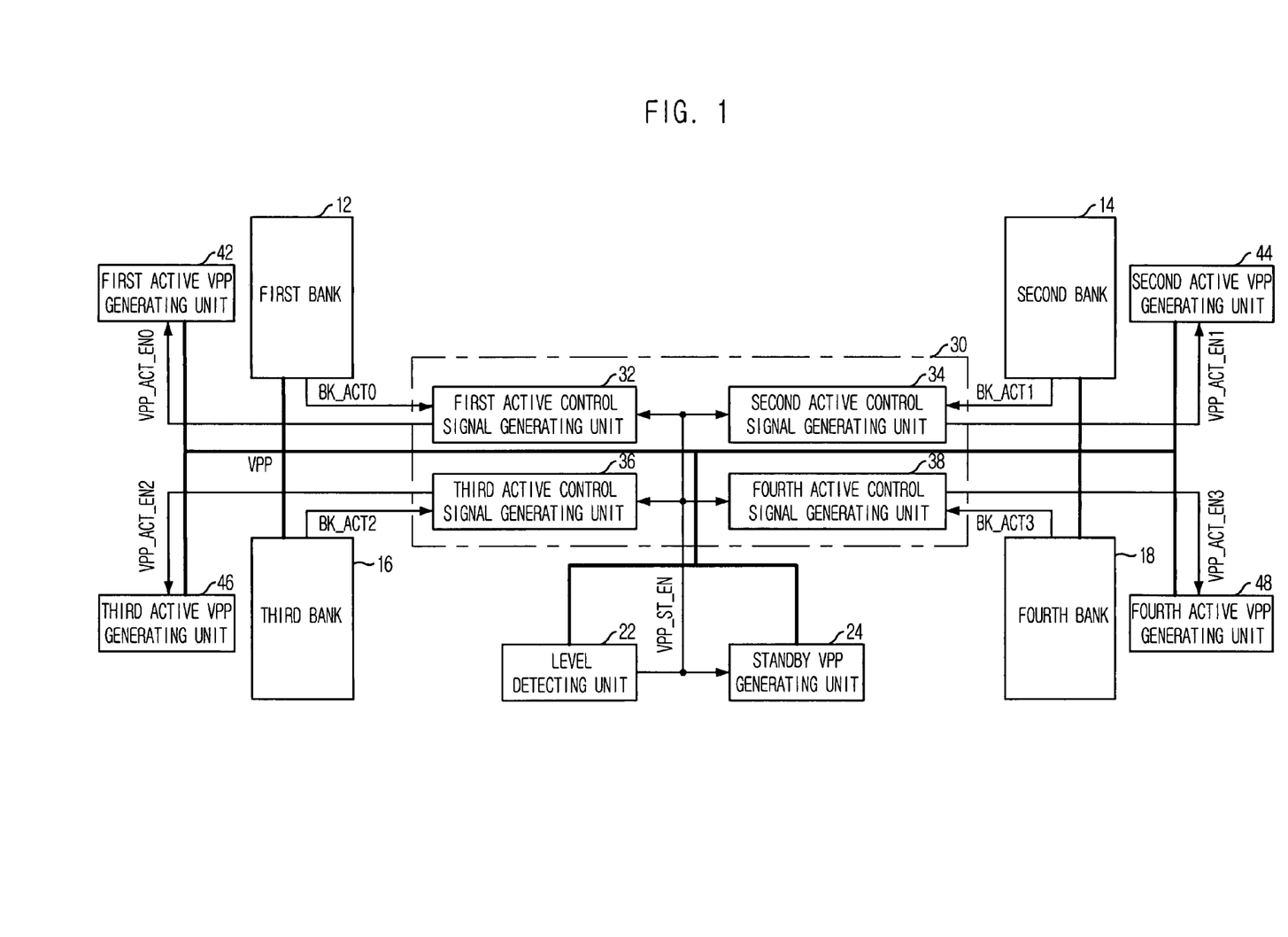
FIG. 1 is a block diagram of a high voltage generator according to a conventional semiconductor memory device.

FIG. 1 is a block diagram of a high voltage generator according to a conventional semiconductor memory device, wherein the high voltage generator generates a high voltage (VPP) which is higher than an external voltage (VDD).

Referring to FIG. 1, the high voltage generator according to the conventional semiconductor memory device includes a level detecting unit 22, a standby VPP generating unit 24, first to fourth banks 12, 14, 16 and 18, an active control signal generating unit 30 and first to fourth active VPP generating units 42, 44, 46 and 48. The level detecting unit 22 detects a high voltage (VPP) and then produces a high voltage driving signal VPP_ST_EN. The standby VPP generating unit 24 produces the high voltage (VPP) having a voltage level higher than an external voltage (VDD) in response to the high voltage driving signal VPP_ST_EN. Each of the first to fourth banks 12, 14, 16 and 18 stores data and reads out them in response to a corresponding bank driving signal BK_ACT0, BK_ACT1, BK_ACT2 or BK_ACT3. The active control signal generating unit 30 receives a plurality of bank driving signals BK_ACT0, BK_ACT1, BK_ACT2 and BK_ACT3 and the high voltage driving signal VPP_ST_EN and then produces a plurality of high voltage active driving signals VPP_ACT_EN_0, VPP_ACT_EN_1, VPP_ACT_EN_2 and VPP_ACT_EN_3. Each of the first to fourth active VPP generating units 42, 44, 46 and 48 produces the high voltage in response to the corresponding high voltage active driving signal VPP_ACT_EN_0, VPP_ACT_EN_1, VPP_ACT_EN_2 or VPP_ACT_EN_3.

The active control signal generating unit 30 includes first to fourth active control signal generating units 32, 34, 36 and 38. The first active control signal generating unit 32 produces the first high voltage active driving signal VPP_ACT_EN_0 in response to the first bank driving signal BK_ACT0 of the first bank 12 and an activation of the high voltage driving signal VPP_ST_EN. The second active control signal generating unit 34 produces the second high voltage active driving signal VPP_ACT_EN_1 in response to the second bank driving signal BK_ACT1 of the second bank 14 and the activation of the high voltage driving signal VPP_ST_EN. The third active control signal generating unit 36 produces the third high voltage active driving signal VPP_ACT_EN_2 in response to the third bank driving signal BK_ACT2 of the third bank 16 and the activation of the high voltage driving signal VPP_ST_EN. Finally, the fourth active control signal generating unit 38 produces the fourth high voltage active driving signal VPP_ACT_EN_3 in response to the fourth bank driving signal BK_ACT3 of the fourth bank 18 and the activation of the high voltage driving signal VPP_ST_EN.

For reference, the first to fourth active VPP generating units 42, 44, 46 and 48 are respectively arranged in the vicinity of the first to fourth banks 12, 14, 16 and 18 so that each of the first to fourth active VPP generating units 42, 44, 46 and 48 produces the corresponding high voltage (VPP) when the corresponding bank is activated.

The operation of the high voltage generator according to the conventional semiconductor memory device of FIG. 1 will be described below.

First, the level detecting unit 22 decides whether the high voltage (VPP) undergoes a voltage drop to a level below a reference level and activates the high voltage driving signal VPP_ST_EN. Subsequently, the standby VPP generating unit 24 is activated by the high voltage driving signal VPP_ST_EN. The activated standby VPP generating unit 24 conducts an operation for charge-pumping the external voltage (VDD) in order to produce the high voltage (VPP) so that the high voltage (VPP) is maintained in the reference level.

Moreover, if the corresponding bank driving signal BK_ACT0, BK_ACT1, BK_ACT2 or BK_ACT3 is activated during the activation of the high voltage signal VPP_ST_EN, the active control signal generating unit 30 activates the corresponding high voltage active driving signal VPP_ACT_EN_0, VPP_ACT_EN_1, VPP_ACT_EN_2 or VPP_ACT_EN_3 in response to the activation of the corresponding bank driving signal BK_ACT0, BK_ACT1, BK_ACT2 or BK_ACT3. Subsequently, the first to fourth active VPP generating units 42, 44, 46 and 48 are additionally activated in response to the corresponding high voltage active driving signal VPP_ACT_EN_0, VPP_ACT_EN_1, VPP_ACT_EN_2 and VPP_ACT_EN_3, thereby supplying the high voltage (VPP).

The reason why the first to fourth active VPP generating units 42, 44, 46 and 48 are additionally activated is that it is necessary to stably maintain the level of the high voltage (VPP) in consideration of the consumption of the high voltage (VPP) which is caused by the activated bank in an active mode.

That is, when the high voltage (VPP) undergoes the voltage drop and is below the reference level, the conventional semiconductor memory device supplies the high voltage (VPP) by driving the standby VPP generating unit 24 and additionally drives the first to fourth active VPP generating units 42, 44, 46 and 48 in an active mode where the bank is accessed.

On the other hand, the reason why the high voltage generating units for supplying the high voltage (VPP) are classified into the standby mode and the active mode as described above is that an amount of power consumption of the high voltage (VPP) in the standby mode is different from that in the active mode. That is, in order to achieve the reduction of the power consumption and the implementation area, the drivability of the high voltage generating units is controlled according to the amount to be required in each mode. More specifically, since the high voltage (VPP) is little used in the standby mode, the standby VPP generating unit 24 which is activated in this mode can maintain the required voltage level even though the standby VPP generating unit 24 does not have a large drivability. However, since the usage of the high voltage (VPP) is increased in the active mode, the required voltage level is maintained by driving the additional active VPP generating units 42, 44, 46 and 48.

Therefore, it is important to design the semiconductor device so that the standby VPP generating unit 24 and the active VPP generating units 42, 44, 46 and 48 satisfy the required level of the high voltage (VPP) according to the established mode. However, even though the design is set up to control the drivability of the high voltage generating unit, an excessive or insufficient amount of the voltage level can be caused by the amount of the supplied external voltage (VDD) in the actual operation. With respect to this problem, the detailed operation will be described below referring to FIG. 2.

Figure 2:
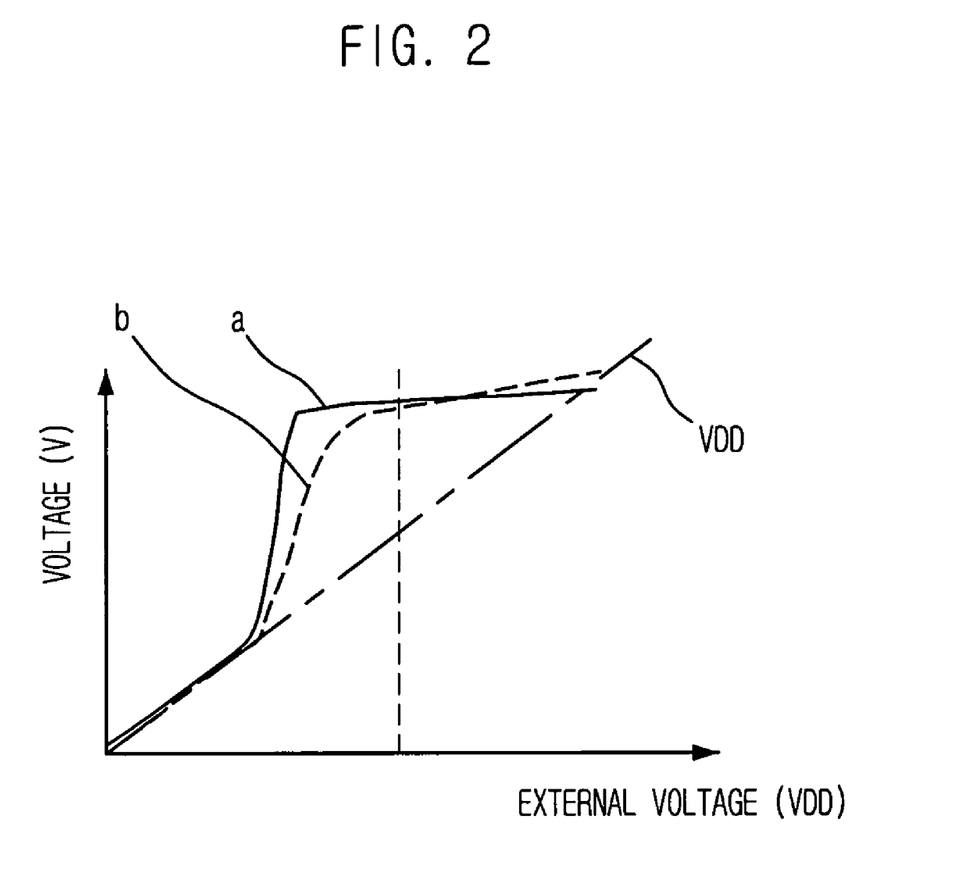
FIG. 2 is a graph showing the variation of the high voltage according to an external voltage.

FIG. 2 is a graph showing a variation of the high voltage (VPP) in the standby mode and the active mode according to the external voltage (VDD). For reference, 'a' expressed by the solid line shows the level of the high voltage (VPP) in the standby mode and 'b' expressed by the dotted line shows the level of the high voltage (VPP) in the active mode.

As shown in FIG. 2, the high voltage (VPP) is generated when the level of the external voltage (VDD) is secured over a predetermined value. After the external voltage (VDD) is secured, the level of the high voltage (VPP) is kept in a stable level regardless of the increase of the external voltage (VDD) along the solid line 'a'.

However, in the case of the dotted line 'b', when the level of the external voltage (VDD) is low, the high voltage (VPP) is supplied in the relatively low level, as compared with that in the case of the solid line 'a'. Also, in the case of 'b', when the level of the external voltage (VDD) is high, the high voltage (VPP) is supplied in the relatively high level, as compared with that in the case of the solid line 'a'. That is, it is seen that level 'b' of the high voltage (VPP) in the active mode is affected by the amount of the supplied external voltage (VDD) and then is not maintained in a stable voltage level.

In order words, the level of the high voltage (VPP) is very much affected by the external voltage (VDD) in the active mode, as compared with that in the standby mode.

More specifically, the standby VPP generating unit 24 supplies the high voltage (VPP) higher than the external voltage (VDD) by charge-pumping the external voltage (VDD). However, although the standby VPP generating unit 24 has a driving force, the amount of the supplied high voltage (VPP) that is provided by the standby VPP generating unit 24 is also small regardless of the driving force of the standby VPP generating unit 24 in the case where the amount of the supplied external voltage (VDD) is relatively small. Moreover, in the case where the level of the external voltage (VDD) is high and the amount of the supplied external voltage (VDD) increases, the amount of the supplied high voltage (VPP) which is provided by the standby VPP generating unit 24 may become greater.

However, as illustrated above, since the power consumption of the high voltage (VPP) is small in the standby mode, the level of the high voltage (VPP) can be stably maintained even if the amount of the supplied high voltage (VPP) is reduced due to the low amount of the external voltage (VDD).

On the other hand, since the power consumption of the high voltage is much greater in the active mode, the amount of the high voltage (VPP) is also reduced, when the high voltage (VPP) is caused by the low level of the external voltage (VDD), and this reduced high voltage can not satisfy the required power supply to make a normal operation achieved in the circuit. In the active mode, if the external voltage (VDD) has a high level, the supplied amount of the high voltage (VPP) is also increased and the increased high voltage (VPP) is over the required amount for normal circuit operation.

Therefore, to solve this problem, if the driving force of the active VPP generating unit is increased based on the low level of the external voltage (VDD), the insufficient amount of the high voltage (VPP) can be compensated. However, when the external voltage (VDD) is increased, the high voltage (VPP) may be excessive.

Therefore, in the active mode, the high voltage (VPP) is affected by the level of the external voltage (VDD) so that the high voltage (VPP) is unable to be adequately supplied and is below the reference level or is excessively supplied over the reference level. As a result, the conventional high voltage generating unit has a problem in that the reference level is not maintained stably.

As described above, the phenomenon that the level of the high voltage is unable to be stably maintained by the level of the external voltage can be caused by the ambient temperature, at the time of driving the VPP generating unit, or the manufacturing process of the semiconductor memory device. For example, even though the level of the external voltage is kept stable, the driving force of the VPP generating unit may be increased or decreased by the ambient temperature or the processing of the semiconductor device. In the standby mode, the high voltage can be supplied to an internal circuit regardless of the variation of the driving force because the power consumption is relatively small; however, in the active mode, the reduction of the driving force decrease the level of the high voltage and the increase of the driving force makes the level of the high voltage increased, because the power consumption of the high voltage is much more.

The high voltage generating unit according to the conventional semiconductor device supplies the high voltage insufficiently or excessively in compliance with the external voltage, the processing procedures and the variation of the ambient temperature. Therefore, the reliability of the device is decreased due to the data failure and the yield of the device is also decreased because the high voltage is not provided appropriately to the internal circuit of the device.

SUMMARY OF THE INVENTION

Embodiments of the present invention are directed to provide a semiconductor memory device having a high voltage generating unit which is capable of stably supplying a high voltage regardless of external effects on voltage, processes and temperature.

According to an aspect of the present invention, there is provided a semiconductor memory device comprising: a test internal voltage supply means for generating a test internal voltage based on a reference voltage; a level detecting mean for detecting a level of an internal voltage based on the reference voltage and for producing an internal voltage driving signal; a standby internal voltage generating means for supplying an standby internal voltage in response to the internal voltage driving signal in a standby mode; a mode detecting means for detecting the level of the internal voltage based on the test internal voltage and producing a plurality of mode signals; a plurality of active internal voltage generating means for supplying the internal voltage in an active mode, wherein the active internal voltage generating means is driven by one of a plurality of active high voltage driving signals; a supplementary active internal voltage generating means for additionally supplying a supplementary internal voltage when an amount of an external voltage is not sufficient in the active mode; and an active control means for selectively driving the plurality of active internal voltage generating means and the supplementary active internal voltage generating means in response to the plurality of mode signals and the internal voltage driving signal.

According to another aspect of the present invention, there is provided a semiconductor memory device comprising: a level detecting mean for detecting a level of an internal voltage based on a reference voltage and for producing an internal voltage driving signal; a standby internal voltage generating means for supplying an standby internal voltage in response to the internal voltage driving signal in a standby mode, using an external voltage as a power source; a mode signal generating means for detecting a voltage level of the internal voltage and for producing a plurality of mode signals; a plurality of active internal voltage generating means for supplying the internal voltage in an active mode, wherein the active internal voltage generating means is driven by one of a plurality of active high voltage driving signals; a supplementary active internal voltage generating means for additionally supplying a supplementary internal voltage when an amount of an external voltage is not sufficient in the active mode; and an active control means for selectively driving the plurality of active internal voltage generating means and the supplementary active internal voltage generating means in response to the plurality of mode signals and the internal voltage driving signal.

According to further another aspect of the present invention, there is provided a semiconductor memory device comprising a plurality of active internal voltage generating means for supplying an internal voltage in an active mode, wherein the active internal voltage generating means is driven by one of a plurality of active high voltage driving signals, a supplementary active internal voltage generating means for additionally supplying a supplementary internal voltage when an amount of an external voltage is not sufficient in the active mode, and an active control means for selectively controlling the plurality of active internal voltage generating means and the supplementary active internal voltage generating means in response to a plurality of mode signals and an internal voltage driving signal.

DESCRIPTION OF SPECIFIC EMBODIMENTS

Embodiments of the present invention will be described with reference to the accompanying drawings. Since these embodiments are provided so that a person of ordinary skill in the art will be able to understand the present invention, they may be modified in various manners and the scope of the present invention is not limited by the embodiments described herein.

Figure 3:
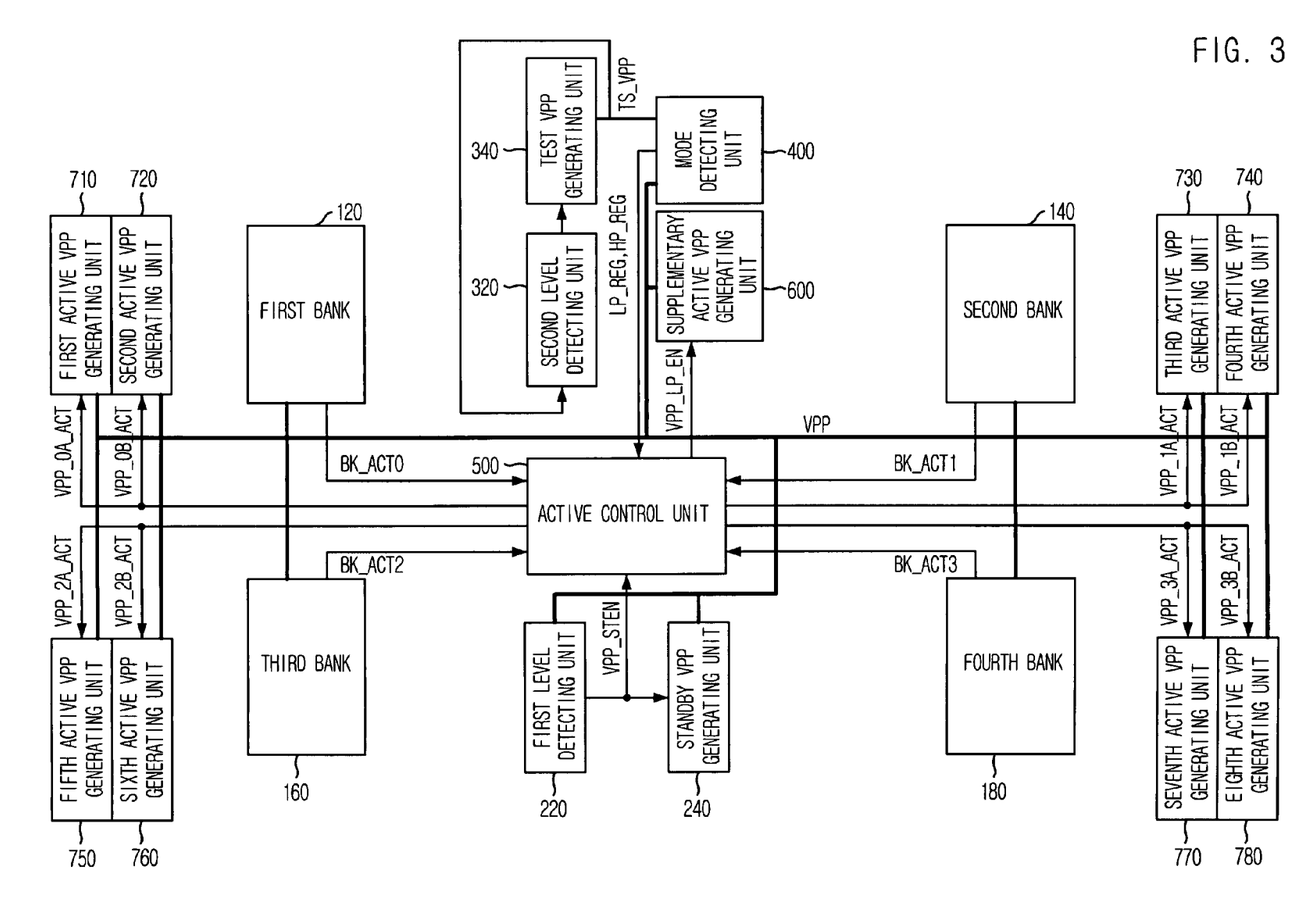
FIG. 3 is a block diagram of a semiconductor memory device including a high voltage generating unit according to one embodiment of the present invention.

FIG. 3 is a block diagram of a semiconductor memory device including a high voltage generating unit according to one embodiment of the present invention.

Referring to FIG. 3, the semiconductor memory device according to the present invention includes a test high-voltage supplier 300, a mode detecting unit 400, a first level detecting unit 220, first to fourth banks 120, 140, 160 and 180, a standby VPP generating unit 240, a plurality of active VPP generating units 710, 720, 730, 740, 750, 760, 770 and 780, a supplementary active VPP generating unit 600 and an active control unit 500. The test high-voltage supplier 300 generates a high test voltage TS_VPP based on a reference voltage. The mode detecting unit 400 compares a high voltage (VPP) with the high test voltage TS_VPP and produces a plurality of mode signals LP_REG and HP_REG. The first level detecting unit 220 detects the level of the high voltage (VPP) based on the reference voltage and produces a high voltage driving signal VPP_ST_EN. The standby VPP generating unit 240 supplies the high voltage (VPP) in response to a high voltage driving signal VPP_ST_EN and the supplementary active VPP generating unit 600 function as a supplementary suppliers of the high voltage (VPP). The active control unit 500 selectively drives the plurality of the active VPP generating units 710, 720, 730, 740, 750, 760, 770 and 780 and the supplementary active VPP generating unit 600 in response to a plurality of the bank driving signals BK_ACT0, BK_ACT1, BK_ACT2 and BK_ACT3, the plurality of mode signals LP_REG and HP_REG and the high voltage driving signal VPP_ST_EN.

First to eighth active VPP generating units 710, 720, 730, 740, 750, 760, 770 and 780 are respectively driven in response to an activation of a corresponding one of a plurality of high voltage active driving signals VPP_0A_ACT, VPP_0B_ACT, VPP_1A_ACT, VPP_1B_ACT, VPP_2A_ACT, VPP_2B_ACT, VPP_3A_ACT and VPP_3B_ACT for supplying the high voltage (VPP) and the supplementary active VPP generating unit 600 additional supplies the high voltage (VPP) in response to a high supplementary voltage driving signal VPP_LP_EN when an amount of an external voltage is not sufficient in the active mode.

The test high-voltage supplier 300 includes a test VPP generating unit 340 for supplying the high test voltage TS_VPP and a second level detecting unit 320 for detecting a level of the high test voltage TS_VPP based on the reference voltage and for controlling the driving of the test VPP generating unit 340.

For reference, since the high test voltage TS_VPP is used only in the mode detecting unit 400, the drivability of the test VPP generating unit 340 is smaller than that of the standby VPP generating unit 240 and the active VPP generating units 710, 720, 730, 740, 750, 760, 770 and 780 and the supplementary active VPP generating unit 600. Moreover, since the used amount of the high test voltage TS_VPP is considerably small, it is maintained in a constant voltage level regardless of the standby or active mode. Also, the level of the high test voltage TS_VPP supplied by the test VPP generating unit 340 is not influenced even if the amount of the supplied external voltage (VDD) is decreased. The high test voltage TS_VPP is stably maintained regardless of the level of the external voltage (VDD) and the action mode of the semiconductor memory device. Furthermore, since a voltage level, which is used for a reference value at the time of generating the high test voltage TS_VPP, is the same as that of the reference voltage for the high voltage (VPP), the high test voltage TS_VPP has the same level as the high voltage (VPP) of the standby mode.

Moreover, the first to eighth active VPP generating units 710, 720, 730, 740, 750, 760, 770 and 780 respectively have the driving force of ½, as compared with the active VPP generating units 42, 44, 46 and 48 of the conventional semiconductor memory device in FIG. 1. That is, when all of the first to eighth active VPP generating units 710, 720, 730, 740, 750, 760, 770 and 780 are driven, they have the same driving force as the first to fourth active VPP generating units 42, 44, 46 and 48 of FIG. 1.

Since the semiconductor memory device according to the present invention can control the number of the VPP generating units by detecting the amount of the supplied external voltage (VDD), the level of the high voltage (VPP) is stably maintained through the compensation for the loss on the amount of the supplied external voltage (VDD).

In other words, the semiconductor memory device according to the present invention further includes the test high-voltage supplier 300, which has the test VPP generating unit 340 and the second level detecting unit 320, for producing the high test voltage TS_VPP to maintain a stable voltage level regardless of the level of the external voltage (VDD). A plurality of the mode signals LP_REG and HP_REG are produced by deciding whether the amount of the supplied external voltage (VDD) is sufficient or not and this decision is made by detecting a voltage level of the high voltage (VPP) based on the high test voltage TS_VPP in the mode detecting unit 400. Also, the semiconductor memory device according to the present invention further includes the plurality of active VPP generating units 710, 720, 730, 740, 750, 760, 770 and 780 and the supplementary active VPP generating unit 600 and controls the number of active VPP generating units 710, 720, 730, 740, 750, 760, 770 and 780 and the supplementary active VPP generating unit 600 which are driven in response to the mode signals LP_REG and HP_REG. That is, the number of the active VPP generating units is increased when the amount of the supplied external voltage (VDD) is relatively small and it is decreased when the amount of the supplied external voltage (VDD) is relatively large.

Therefore, in the present invention, since the amount of the supplied external voltage is sensed through the high test voltage which has the same level as that in the standby mode, the effect of the amount of the supplied conventional external voltage (VDD) is offset and the level of the high voltage (VPP) can be stably maintained.

Referring to the accompanying drawings, the level variation of the high voltage according to the level of the external voltage (VDD) will be described in detail in each mode according to the amount of the supplied external voltage (VDD).

Figure 4:
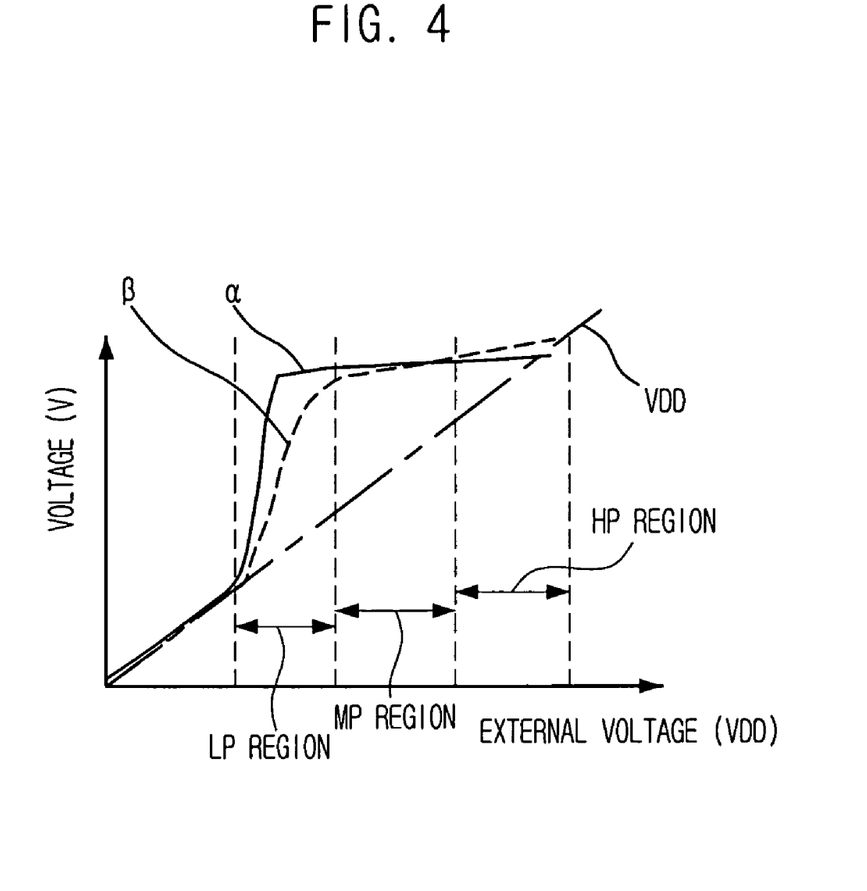
FIG. 4 is a graph showing a mode variation according to an amount of supplied external voltage.

FIG. 4 is a graph showing a mode variation according to the amount of the supplied external voltage (VDD). The modes are determined by the comparison of the voltage level variation which the high test voltage TS_VPP and the high voltage (VPP) have according to the level of the external voltage (VDD). For reference, 'α' expressed by the solid line shows the variation of the high test voltage TS_VPP, in the standby mode, according to the level variation of the external voltage (VDD). Also, in the standby mode, 'α' is identical with the level variation which the high voltage (VPP) has. In the active mode, 'β' expressed by the dotted line shows the variation of the high voltage (VPP) which is caused by the level variation of the external voltage (VDD).

As shown in the FIG. 4, before the level of the external voltage (VDD) is increased up to a predetermined value, the high voltage (VPP) corresponding to the reference voltage is not yet generated.

Thereafter, in the level fluctuation of the external voltage (VDD), 'α' maintains a stable level, whereas 'β' undergoes a level variation. The reason why 'α' maintains the stable level regardless of the level of the external voltage (VDD) is that the amount which is used up in the high test voltage TS_VPP is remarkably tiny. Therefore, the production of the high test voltage TS_VPP corresponding to the reference voltage is facilitated even if the amount of the supplied external voltage (VDD) is not sufficient. For reference, in the standby mode, 'α' has a level form which is similar to that which the high voltage has.

The division of operating regions and the number of the (VPP) generators shown in Table 1.

TABLE 1

| Region | VPP generating units to be driven | | |
|---|---|---|---|
| LP region | Supplementary active VPP generating unit | xA active VPP generating unit | xB active VPP generating unit |
| MP region | | xA active VPP generating unit | xB active VPP generating unit |
| HP region | | xA active VPP generating unit (or xB active VPP generating unit) | |

As shown in FIG. 4, a low power region (hereinafter, referred to as 'LP region') is a region in which 'β' has the level lower than 'α'. In this region, the level of the external voltage (VDD) is low so that the supplied amount is relatively small and a sufficient amount of the high voltage (VPP) required in the active mode is not supplied because of a voltage drop.

At this time, as shown in Table 1, the supplementary active VPP generating unit 600 and the first to eighth active VPP generating units 710, 720, 730, 740, 750, 760, 770 and 780 are operated in the LP region. Here, the first to eighth active VPP generating units 710, 720, 730, 740, 750, 760, 770 and 780 are activated according to the activated bank and supplies the high voltage (VPP). Accordingly, as compared with the conventional VPP generating unit in the active mode, the additional supplementary active VPP generating unit 600 according to the present invention compensates for the insufficient amount of the high voltage (VPP) which is caused by the small supply of the external voltage (VDD), thereby satisfying the required amount.

A middle power region (hereinafter, referred to as 'MP region') of the FIG. 4 is a region in which the amount of the supplied external voltage (VDD) is appropriate and 'β' is similar to 'α' in the voltage level. In this region, since the external voltage (VDD) is stably supplied, the level of the high voltage (VPP) is stably maintained. As shown in Table 1, in the MP region, the first to eighth active VPP generating units 710, 720, 730, 740, 750, 760, 770 and 780 are operated so that the high voltage (VPP) required in the active mode is stably supplied. For reference, the MP region is a state at which the semiconductor memory device generally runs.

A high power region (hereinafter, referred to as 'HP region') of the FIG. 4 is a region in which a large amount of the supplied external voltage (VDD) is supplied so that 'β' has a level higher than 'α'. Here, since there is a large amount of supplied external voltage (VDD), the high voltage (VPP) is excessively supplied, greater than the appropriate amount required in the active mode. For reference, in the HP region, the various reliability tests, such as confirmation of the characteristics of the device to which the high external voltage (VDD) is applied, can be performed.

If the amount of the supplied external voltage (VDD) is too great and the level of the high voltage (VPP) rises, first, third, fifth and seventh active VPP generating units 710, 730, 750 and 770 are driven as shown in Table 1. That is, in the case where the high voltage (VPP) is excessively supplied, the level boosting of the high voltage (VPP) according to the excessive amount of the supplied external voltage (VDD) is reduced by reducing the driving force of the VPP generating unit in half in comparison with a conventional driving force.

Therefore, in the semiconductor memory device according to the present invention, the high test voltage TS_VPP is not affected in the level of the external voltage (VDD) and is stably maintained. The modes are classified by measuring the level of the high voltage (VPP) based on the high test voltage TS_VPP and determining the amount of the supplied external voltage (VDD). The insufficiency or excessiveness of the level of the high voltage (VPP) is prevented by controlling the number of the VPP generating unit driven according to each mode.

Subsequently, the circuit diagram of each block will be described in detail.

Figure 5:
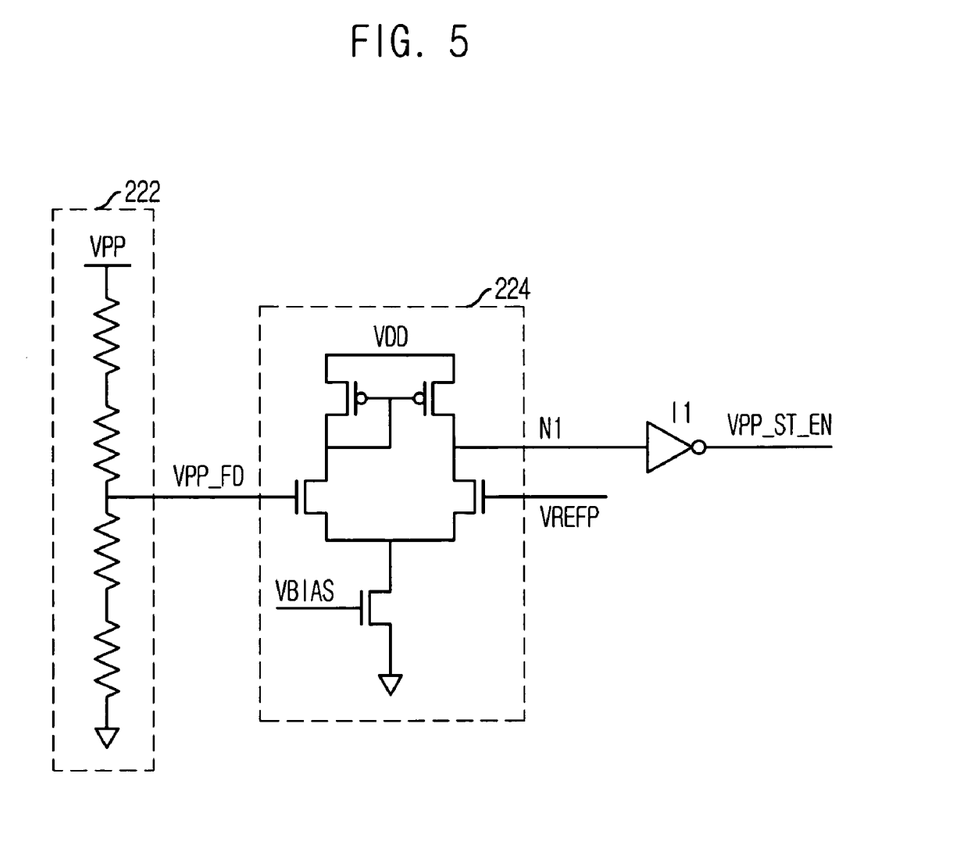
FIG. 5 is a circuit diagram of a first level detecting unit.

FIG. 5 is a circuit diagram of the first level detecting unit 220. The first level detecting unit 220 includes a feedback unit 222 for outputting a first high feedback voltage VPP_FD1 having a constant ratio for the high voltage (VPP), a detecting unit 224 which is activated in response to a bias voltage VBIAS and detects a voltage difference between the first high feedback voltage VPP_FD1 and a reference voltage VREFP, and an inverter I1 for inverting a signal applied to output node N1 of the detecting unit 224 and for outputting the inverted signal as the high voltage driving signal VPP_ST_EN.

The detecting unit 224 includes a differential amplifier to receive the first high feedback voltage VPP_FD1 and the reference voltage VREFP as two input signals. The feedback unit 222 includes a plurality of serial resistors for dividing the high voltage (VPP) and outputting the divided voltages as the first high feedback voltage VPP_FD1.

The feedback unit 222 outputs the first high feedback voltage VPP_FD1 having the constant ratio for the high voltage (VPP). The detecting unit 224 drops the voltage level on output node N1 if the level of the first high feedback voltage VPP_FD1 descends below the reference voltage VREFP and the inverter I1 inverts the dropped voltage in order to activate the high voltage driving signal VPP_ST_EN in a high level (H).

Since the detecting unit 224 increases the voltage level on output node N1 if the level of the high feedback voltage VPP_FD rises over the reference voltage VREFP, the inverter I1 non-activates the high voltage driving signal VPP_ST_EN in a low level (L).

That is, in the case where the high voltage (VPP) descends below a voltage level corresponding to the reference voltage VREFP, the first level detecting unit 220 activates the high voltage driving signal VPP_ST_EN. When the high voltage (VPP) is higher than the reference voltage VREFP, the first level detecting unit 220 non-activates the high voltage driving signal VPP_ST_EN.

For reference, the second level detecting unit 320, which has the same configuration as the above-described first level detecting unit 220, drives the test VPP generating unit 340 when the level of the high test voltage TS_VPP descends below the reference voltage VREFP. The reference voltage VREFP for the high test voltage TS_VPP and the high voltage (VPP) have the same level. Therefore, the high test voltage TS_VPP and the generated high voltage (VPP) may have the same level.

Figure 6:
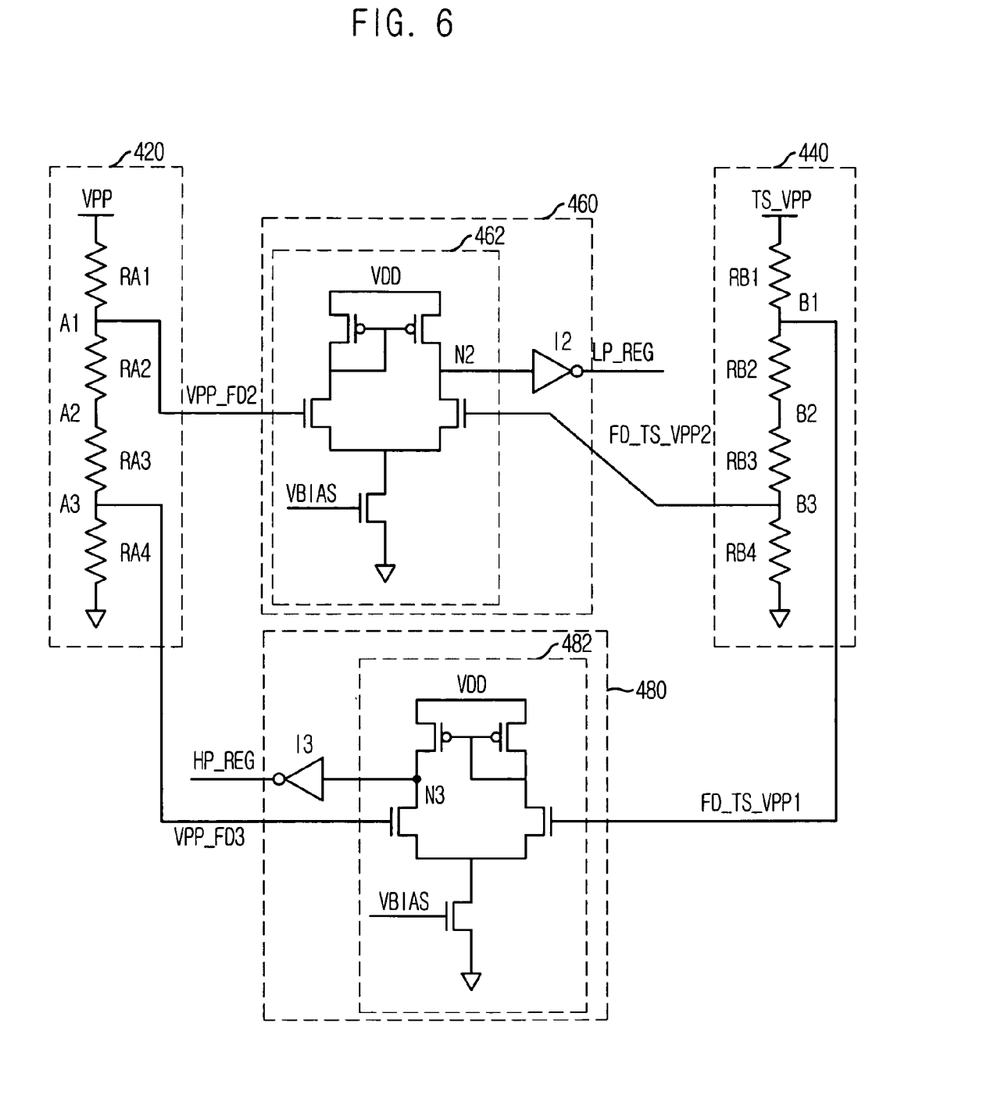
FIG. 6 is a circuit diagram of a mode detecting unit in FIG. 3.

FIG. 6 is a circuit diagram of the mode detecting unit 400 in FIG. 3. Referring to FIG. 6, the mode detecting unit 400 includes: a first feedback unit 420 for outputting second and third high feedback voltages VPP_FD2 and VPP_FD3 having a constant ratio for the high voltage (VPP); a second feedback unit 440 for outputting first and second high feedback test voltages FD_TS_VPP1 and FD_TS_VPP2 having a constant ratio for the high test voltage TS_VPP; a first detecting unit 460 which is activated in response to the bias voltage VBIAS and outputs the low mode signal LP_REG by detecting the level of the second high feedback voltage VPP_FD2 based on the second high feedback test voltage FD_TS_VPP2; and a second detecting unit 480 which is activated in response to the bias voltage VBIAS and outputs the high mode signal HP_REG by detecting the level of the third high feedback voltage VPP_FD3 based on the first high feedback test voltage FD_TS_VPP2.

The first feedback unit 420 includes first to fourth resistors RA1, RA2, RA3 and RA4, which are in series connected to each other between the high voltage (VPP) and a ground voltage (VSS), outputs the voltage which is applied to connection node A1 between the first and second resistors RA1 and RA2 as the second high feedback voltage VPP_FD2, and outputs the voltage which is applied to connection node A3 between the third and fourth resistors RA3 and RA4 as the third high feedback voltage VPP_FD3.

The second feedback unit 440 includes the first to fourth resistors RB1, RB2, RB3 and RB4, which are in series connected to each other between the high test voltage TS_VPP and the ground voltage VSS, outputs the voltage which is applied to connection node B1 between the first and second resistors RB1 and RB2 as the first high feedback test voltage FD_TS_VPP1, and outputs the voltage which is applied to connection node B3 between the third and fourth resistors RB3 and RB4 as the second high feedback test voltage FD_TS_VPP2.

The first resistor RA1 of the first feedback unit 420 and the first resistor RB1 of the second feedback unit 440 have the same resistance value. Moreover, the second resistors RA2 and RB2 of the first and second feedback units 420 and 440 have the same resistance value and the third and fourth resistors RA3, RB3, RA4 and RB4 of the first and second feedback units 420 and 440 are subjected to the same resistance value. The ratio of the voltage levels, which the first and second high feedback test voltages FD_TS_VPP1 and FD_TS_VPP2 and the second and third high feedback voltage VPP_FD2 and VPP_FD3 have respectively, can be controlled through the adjustment of the resistance value.

The first detecting unit 460 includes a differential amplifier 462 to receive the second high feedback voltage VPP_FD2 and the second high feedback test voltage FD_TS_VPP2 as two input signals and an inverter I2 for inverting the voltage, which is applied to output node N2 of the differential amplifier 462, in order to output the inverted voltage signal as the low mode signal LP_REG.

The second detecting unit 480 includes a differential amplifier 482 to receive the third high feedback voltage VPP_FD3 and the first high feedback test voltage FD_TS_VPP1 as two input signals and an inverter I3 for inverting the voltage, which is applied to output node N3 of the differential amplifier 482, in order to output the inverted voltage signal as the high mode signal HP_REG.

Subsequently, the operation of the mode detecting unit 400 will be described in detail.

When the level of the second high feedback voltage VPP_FD2 is higher than that of the second high feedback test voltage FD_TS_VPP2, the first detecting unit 460 increases the voltage level on node N2 up to the level of the external voltage (VDD). The inverter I2 inverts the voltage applied to node N2 and outputs the inverted signal in a low level as the low mode signal LP_REG. When the level of the second high feedback voltage VPP_FD2 is lower than that of the second high feedback test voltage FD_TS_VPP2, node N2 descends to a voltage level of an internal voltage VSS. The inverter I2 inverts the voltage applied to node N2 and outputs the inverted signal in a high level as the low mode signal LP_REG.

When the level of the second high feedback voltage VPP_FD3 is higher than that of the first high feedback test voltage FD_TS_VPP1, the second detecting unit 480 makes the voltage level on node N3 descend up to the level of the ground voltage VSS. The inverter I3 inverts the voltage applied to node N3 and outputs the high mode signal HP_REG in a high level. When the level of the third high feedback voltage VPP_FD3 is lower than that of the first high feedback test voltage FD_TS_VPP1, the voltage applied to node N3 rises up to the level of the external voltage (VDD). The inverter I3 inverts the voltage applied to node N3 and outputs the high mode signal HP_REG in a low level.

In other words, if the level of the second high feedback voltage VPP_FD2 is lower than that of the second high feedback test voltage FD_TS_VPP2, the mode detecting unit 400 activates the low mode signal LP_REG in a high level and, if the level of the third high feedback voltage VPP_FD3 is higher than that of the first high feedback test voltage FD_TS_VPP1, the mode detecting unit 400 activates the high mode signal LP_REG in a high level. Also, if the level of the second high feedback voltage VPP_FD2 is higher than that of the second high feedback test voltage FD_TS_VPP2 and the level of the third high feedback voltage VPP_FD3 is lower than that of the first high feedback test voltage FD_TS_VPP1, the low and high mode signals LP_REG and HP_REG are non-activated in a low level.

That is, the activation of the low mode signal LP_REG is caused when the level of the high voltage (VPP) is lower than that of the high test voltage TS_VPP and the LP region in which the external voltage (VDD) is not sufficiently supplied is related in this case. The activation of the high mode signal HP_REG is caused when the level of the high voltage (VPP) is higher than that of the high test voltage TS_VPP and the HP region in which the external voltage (VDD) is excessively supplied is related in this case. Finally, the case where both the low mode signal LP_REG and the high mode signal HP_REG are non-activated is caused when the high voltage (VPP) maintains a voltage level which is similar to the high test voltage TS_VPP and this case is associated with the MP region.

Figure 7:
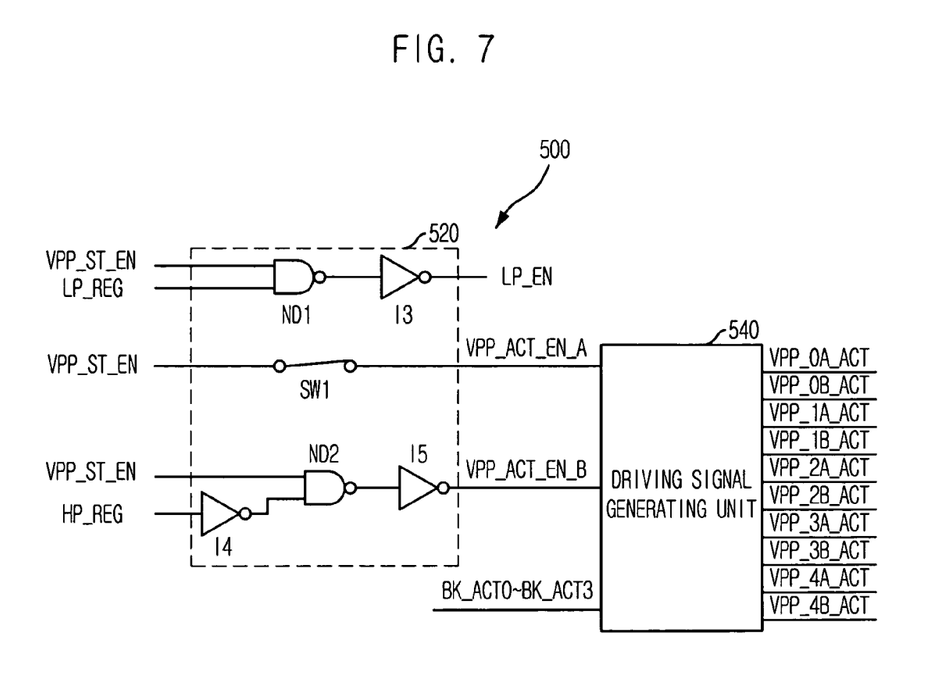
FIG. 7 is a circuit diagram of an active control unit in FIG. 3.

FIG. 7 is a circuit diagram of the active control unit 500 in FIG. 3. Referring to FIG. 7, the active control unit 500 includes a division signal generating unit 520 and a driving signal generating unit 540. The division signal generating unit 520 receives the plurality of mode signals LP_REG and HP_REG and the high voltage driving signal VPP_ST_EN and then produces a plurality of division signals VPP_ACT_EN_A and VPP_ACT_EN_B and the supplementary high-voltage driving signal VPP_LP_EN. The driving signal generating unit 540 receives the plurality of the division signals VPP_ACT_EN_A and VPP_ACT_EN_B and the bank driving signals BK_ACT0, BK_ACT1, BK_ACT2 and BK_ACT3 and then produces the high voltage active driving signals VPP_0A_ACT, VPP_0B_ACT, VPP_1A_ACT, VPP_1B_ACT, VPP_2A_ACT, VPP_2B_ACT, VPP_3A_ACT and VPP_3B_ACT corresponding to these bank driving signals.

The division signal generator 520 includes: a NAND gate ND1 for NANDing the low mode signal LP_REG and the high voltage driving signal VPP_ST_EN; an inverter I4 for inverting an output signal of the NAND gate ND1 and for outputting the inverted signal as the supplementary high-voltage driving signal VPP_LP_EN; a switch SW1 for delivering the high voltage driving signal VPP_ST_EN as the division signal VPP_ACT_EN_A to the driving signal generating unit 540; an inverter I5 for inverting the high mode signal HP_REG; a NAND gate ND2 for NANDing the output signal of the inverter I4 and the high voltage driving signal VPP_ST_EN; and an inverter I6 for inverting an output signal of the NAND gate ND2 and outputting the inverted signal as the division signal VPP_ACT_EN_B.

The driving signal generating unit 540 has a plurality of elements each of which has the same circuit implementation and produces a plurality of high voltage active driving signals. For example, the driving signal generating unit 540 performs a logical multiplication operation of the division signals VPP_ACT_EN_A and the bank driving signal BK_ACT0 and produces the high voltage active driving signal VPP_0A_ACT.

The driving of the active control unit 500 will be described in detail.

Assuming that the high mode signal HP_REG is non-activated and the high voltage driving signal VPP_ST_EN is activated while the low mode signal LP_REG is activated, the division signal generator 520 activates the division signal VPP_ACT_EN_A in response to the high voltage driving signal VPP_ST_EN and activates the supplementary high-voltage driving signal VPP_LP_EN in response to the low mode signal LP_REG and the high voltage driving signal VPP_ST_EN. The division signal VPP_ACT_EN_B is activated in response to the non-activation of the high mode signal HP_REG and the activation of the high voltage driving signal VPP_ST_EN.

Since the division signal VPP_ACT_EN_A and VPP_ACT_EN_B have been activated, the driving signal generating unit 540 activates the corresponding high voltage active driving signal according to the activation of the corresponding bank driving signal BK_ACT0, BK_ACT1, BK_ACT2 or BK_ACT3. For example, the high voltage active driving signals VPP_0A_ACT and VPP_0B_ACT are activated when the bank driving signal BK_ACT0 is activated and the high voltage active driving signals VPP_1A_ACT and VPP_1B_ACT are activated when the bank driving signal BK_ACT1 is activated. Also, the high voltage active driving signals VPP_2A_ACT and VPP_2B_ACT are activated when the bank driving signal BK_ACT2 is activated and the high voltage active driving signals VPP_3A_ACT and VPP_3B_ACT are activated when the bank driving signal BK_ACT3 is activated.

If the low mode signal LP_REG is activated, this means the LP region in which the amount of the supplied external voltage (VDD) is insufficient. Therefore, the active control unit 500, as mentioned above, can activate the supplementary high-voltage driving signal VPP_LP_EN and can also activate all the high voltage active driving signals based on the activation of the corresponding bank driving signal.

Assuming that both the low mode signal LP_REG and the high mode signal HP_REG are non-activated and the high voltage driving signal VPP_ST_EN is activated, the division signal generator 520 activates the division signal VPP_ACT_EN_A in response to the high voltage driving signal VPP_ST_EN and activates the division signal VPP_ACT_EN_B in response to the non-activation of the high mode signal HP_REG and the activation of the high voltage driving signal VPP_ST_EN. The supplementary high-voltage driving signal VPP_LP_EN is non-activated in response to the non-activation of the low mode signal LP_REG.

Since the division signal VPP_ACT_EN_A and VPP_ACT_EN_B have been activated, the driving signal generating unit 540 activates the corresponding high voltage active driving signal according to the activation of the corresponding bank driving signal BK_ACT0, BK_ACT1, BK_ACT2 or BK_ACT3.

If both the low mode signal LP_REG and the high mode signal HP_REG are non-activated, this means the MP region in which the amount of the external voltage (VDD) is adequately supplied. Therefore, the active control unit 500, as mentioned above, can activate the supplementary high-voltage driving signal VPP_LP_EN and can activate the high voltage active driving signal based on the activation of the corresponding bank driving signal.

Finally, assuming that the high voltage driving signal VPP_ST_EN is activated when the low mode signal LP_REG is non-activated and the high mode signal HP_REG is activated, the division signal generator 520 activates the division signal VPP_ACT_EN_A in response to the high voltage driving signal VPP_ST_EN. The division signal VPP_ACT_EN_B is non-activated in response to the activation of the high mode signal HP_REG and the supplementary high-voltage driving signal VPP_LP_EN is non-activated in response to the non-activation of the low mode signal LP_REG.

Since the division signal VPP_ACT_EN_A has been activated, the driving signal generating unit 540 selectively activates one of the corresponding high voltage active driving signals VPP_0A_ACT, VPP_1A_ACT, VPP_2A_ACT and VPP_3A_ACT according to the activation of the corresponding bank driving signal BK_ACT0, BK_ACT1, BK_ACT2 or BK_ACT3.

If the high mode signal is activated, this means the HGP region in which the amount of the external voltage (VDD) is excessively supplied. Therefore, the active control unit 500, as mentioned above, non-activates the supplementary high-voltage driving signal VPP_LP_EN and the high voltage active driving signals VPP_0B_ACT, VPP_1B_ACT, VPP_2B_ACT and VPP_3B_ACT. The high voltage active driving signals VPP_0A_ACT, VPP_1A_ACT, VPP_2A_ACT and VPP_3A_ACT can be selectively activated based on the activation of corresponding bank driving signal BK_ACT0, BK_ACT1, BK_ACT2 and BK_ACT3.

The active control unit 500 controls the number of activated signals of the high voltage active driving signals and the activation of the supplementary high-voltage driving signal according to the mode signal LP_REG and HP_REG.

As illustrated above, the semiconductor memory device according to the present invention makes the supplementary VPP generating unit activated to a maximum in the case where the amount of the supplied external voltage is relatively small and prevents the excessive high voltage in the case of the large amount of the external voltage, thereby preventing the excessive power consumption of the high voltage (VPP).

Therefore, the semiconductor memory device equipped with the high voltage generator according to the present invention produces the high test voltage to maintain the stable voltage level regardless of the amount of the supplied external voltage, detects the level of the high voltage in the active mode based on the produced high test voltage, and controls the amount of the high voltage to be supplied. Therefore, the level of the high voltage is stably maintained regardless of the amount of the supplied external voltage.

Also, the present invention can stably supply the high voltage even if not only the PVT (Process, Voltage, and Temperature) fluctuations but also the level fluctuations of the external voltage are caused by the variation of the external environments. The driving force of the standby VPP generating unit and the plurality of the active VPP generating units are changed according to the PVT fluctuations. That is, even if the driving force of the test VPP generating unit is changed by the PVT fluctuations, the high test voltage is stably maintained because the high test voltage is used up in the mode detecting unit. Since the high test voltage is maintained in a stable voltage level at the time of the PVT fluctuations, the amount of the high voltage which is controlled based on it can be also maintained in a stable voltage level regardless of the PVT fluctuations.

Instead of maintaining the stable level of the high test voltage regardless of the amount of the supplied external voltage and an operating mode, the present invention can control the amount of the high voltage supply by directly detecting the level of the external voltage and determining if the amount of the external voltage supply is sufficient or not. This case to directly detect the level of the external voltage also has the same effect as described above.

In this case, it is not necessary to have the high test voltage suppliers 320 and 340. The mode detecting unit 400 receives the external voltage (VDD) instead of the high test voltage TS_VPP and receives an expected voltage based on the external voltage (VDD) instead of the high voltage (VPP). To briefly illustrate only the mode detecting unit 400, the low mode signal LP_REG is activated in the case where the external voltage (VDD) has the level higher than an expected voltage and the high mode signal HP_REG is activated in the case where the level of the external voltage (VDD) has the level lower than the expected voltage. In the case of having a level corresponding to the expected voltage, the low mode signal LP_REG and the high mode signal HP_REG are non-activated. Besides, this case has the same configuration and operation.

Therefore, in the case where the amount of the high voltage is controlled by detecting the amount of the supplied external voltage, the level of the high voltage can be stably maintained regardless of the amount of the external voltage.

The above-described present invention is applicable to the internal voltage generator, to which the external voltage is applied, as well as the high voltage generator. That is, the amount of the internal voltage can be controlled based on a test internal voltage to maintain a stable voltage level in spite of the PVT fluctuations.

As apparent from the present invention, the high voltage can be stably maintained regardless of the PVT fluctuations, because the voltage which is not affected by the PVT fluctuations is produced and the driving force the high voltage is controlled based on this PVT free voltage.

While the present invention has been described with respect to certain preferred embodiments, it will be apparent to those skilled in the art that various changes and modifications may be made without departing from the spirit and scope of the invention as defined in the following claims. For example, the configuration and type of the logic gates and the transistors can be modified and changed.

What is claimed is:

1. A semiconductor memory device comprising:
   a test internal voltage supply means for generating a test internal voltage based on a reference voltage;
   a level detecting means for detecting a level of an internal voltage based on the reference voltage and for producing an internal voltage driving signal;
   a standby internal voltage generating means for supplying an standby internal voltage in response to the internal voltage driving signal in a standby mode;

a mode detecting means for detecting the level of the internal voltage based on the test internal voltage and producing a plurality of mode signals;

a plurality of active internal voltage generating means for supplying the internal voltage in an active mode, wherein the active internal voltage generating means is driven by one of a plurality of active high voltage driving signals;

a supplementary active internal voltage generating means for additionally supplying a supplementary internal voltage when an amount of an external voltage is not sufficient in the active mode; and an active control means for selectively driving the plurality of active internal voltage generating means and the supplementary active internal voltage generating means in response to the plurality of mode signals and the internal voltage driving signal.

2. The semiconductor memory device in accordance with claim 1, wherein the test internal voltage is used only in the mode detecting means.

3. The semiconductor memory device in accordance with claim 2, wherein the standby internal voltage is a charge pumping voltage caused by an external voltage and wherein the standby internal voltage is a high voltage which is higher than the external voltage.

4. The semiconductor memory device in accordance with claim 3, wherein the mode detecting means includes:
a first feedback unit for outputting first and second feedback internal voltages, each of which is different from the internal voltage in a voltage level;
a second feedback unit for outputting first and second feedback test internal voltages, each of which is different from the test internal voltage in a voltage level;
a first detecting unit activated in response to a bias voltage for detecting a voltage level of the first feedback test internal voltages based on the second feedback test internal voltages and for producing a low mode signal; and
a second detecting unit activated in response to the bias voltage for detecting a voltage level of the second feedback test internal voltages based on the first feedback test internal voltages and for producing a high mode signal.

5. The semiconductor memory device in accordance with claim 4, wherein an amount of voltage driven by the test internal voltage supply means is much less than that driven by the internal voltage generating mean.

6. The semiconductor memory device in accordance with claim 5, wherein the first feedback unit includes first to fourth resistors which are in series coupled to each other between the internal voltage and a ground voltage and wherein a voltage applied to a connection node between the first resistor and the second resistor is output as the first feedback internal voltages and a voltage applied to a connection node between the third resistor and the fourth resistor is output as the second feedback internal voltages.

7. The semiconductor memory device in accordance with claim 6, wherein the second feedback unit includes fifth to eighth resistors which are in series coupled to each other between the test internal voltage and the ground voltage, wherein a voltage applied to a connection node between the fifth and sixth resistors is output as the fist feedback test internal voltage, and wherein a voltage applied to a connection node between the seventh and eighth resistors is output as the second feedback test internal voltage.

8. The semiconductor memory device in accordance with claim 7, wherein the first and fifth resistors have the same resistance value, the second and sixth resistors have the same resistance value, the third and seventh resistors have the same resistance value, and the fourth and eighth resistor have the same resistance value.

9. The semiconductor memory device in accordance with claim 8, wherein the first detecting unit includes:
a first differential amplifier receiving the first feedback internal voltage and the second feedback test internal voltages as two input signals; and
a first inverter for inverting a voltage which is applied to an output node of the first differential amplifier.

10. The semiconductor memory device in accordance with claim 9, wherein the second detecting unit includes:
a second differential amplifier receiving the second feedback internal voltage and the first feedback test internal voltages as two input signals; and
a second inverter for inverting a voltage which is applied to an output node of the second differential amplifier.

11. The semiconductor memory device in accordance with claim 3, further comprising:
a plurality of cells to store data; and
a plurality of banks for selectively outputting the data of the corresponding cell based on an input of the internal voltage when the corresponding bank driving signal is activated.

12. The semiconductor memory device in accordance with claim 11, wherein the supplementary active internal voltage generating means supplies the high voltage in response to a supplementary high-voltage driving signal and wherein each bank receives the internal voltage from at least two active internal voltage generating means.

13. The semiconductor memory device in accordance with claim 12, wherein the active control means includes:
a division signal generating unit receiving the plurality of mode signals and the internal voltage driving signal for producing a plurality of division signals and the supplementary high-voltage driving signal; and
a driving signal generating unit receiving the plurality of division signals and the plurality of bank driving signals for outputting a corresponding signal of the plurality of active high-voltage driving signal.

14. The semiconductor memory device in accordance with claim 13, wherein the division signal generating unit includes:
a first NAND gate for NANDing the low mode signal and the high voltage driving signal;
a first inverter for inverting an output signal of the first NAND gate and for outputting to the high supplementary voltage driving signal;
a first switch for delivering the high voltage driving signal as the first division signal;
a second inverter for inverting the high mode signal;
a second NAND gate for NANDing an output signal of the second inverter and the high voltage driving signal; and
a third inverter for inverting an output signal of the second NAND gate and for outputting the inverted signal as the second division signal.

15. The semiconductor memory device in accordance with claim 14, wherein the test internal voltage supply means includes:
a test internal voltage generating unit for supplying the test internal voltage; and
a detecting unit for detecting a voltage level of the test internal voltage based on the reference voltage and for controlling a driving of the test internal voltage generating unit.

16. The semiconductor memory device in accordance with claim 15, wherein the detecting unit is a differential amplifier receiving the reference voltage and the test internal voltage as two input signals.

17. The semiconductor memory device in accordance with claim 3, wherein the mode detecting means includes:
   a first feedback unit for outputting first and second feedback internal voltages, each of which is different from the internal voltage in a voltage level;
   a second feedback unit for outputting first and second feedback external voltages, each of which is different from the test internal voltage in a voltage level;
   a first detecting unit activated in response to a bias voltage for detecting a voltage level of the first feedback internal voltages based on the second feedback external voltages and for producing a low mode signal; and
   a second detecting unit activated in response to the bias voltage for detecting a voltage level of the second feedback internal voltages based on the first feedback external voltages and for producing a high mode signal.

18. The semiconductor memory device in accordance with claim 17, wherein the first feedback unit includes first to fourth resistors which are in series coupled to each other between the internal voltage and a ground voltage and wherein a voltage applied to a connection node between the first resistor and the second resistor is output as the first feedback internal voltages and a voltage applied to a connection node between the third resistor and the fourth resistor is output as the second feedback internal voltages.

19. The semiconductor memory device in accordance with claim 18, wherein the second feedback unit includes fifth to eighth resistors which are in series coupled to each other between the external voltage and the ground voltage, wherein a voltage applied to a connection node between the fifth and sixth resistors is output as the first feedback external voltage, and wherein a voltage applied to a connection node between the seventh and eighth resistors is output as the second feedback external voltage.

20. The semiconductor memory device in accordance with claim 19, wherein the first and fifth resistors have the same resistance value, the second and sixth resistors have the same resistance value, the third and seventh resistors have the same resistance value, and the fourth and eighth resistor have the same resistance value.

21. A semiconductor memory device comprising:
   a level detecting mean for detecting a level of an internal voltage based on a reference voltage and for producing an internal voltage driving signal;
   a standby internal voltage generating means for supplying an standby internal voltage in response to the internal voltage driving signal in a standby mode, using an external voltage as a power source;
   a mode signal generating means for detecting a voltage level of the internal voltage and for producing a plurality of mode signals;
   a plurality of active internal voltage generating means for supplying the internal voltage in an active mode, wherein the active internal voltage generating means is driven by one of a plurality of active high voltage driving signals;
   a supplementary active internal voltage generating means for additionally supplying a supplementary internal voltage when an amount of an external voltage is not sufficient in the active mode; and
   an active control means for selectively driving the plurality of active internal voltage generating means and the supplementary active internal voltage generating means in response to the plurality of mode signals and the internal voltage driving signal.

22. The semiconductor memory device in accordance with claim 21, wherein the standby internal voltage is a charge pumping voltage caused by an external voltage and wherein the standby internal voltage is a high voltage which is higher than the external voltage.

23. The semiconductor memory device in accordance with claim 22, further comprising:
   a plurality of cells to store data; and
   a plurality of banks for selectively outputting the data of the corresponding cell based on an input of the internal voltage when the corresponding bank driving signal is activated.

24. The semiconductor memory device in accordance with claim 23, wherein the supplementary active internal voltage generating means supplies the high voltage in response to a supplementary high-voltage driving signal and wherein each hank receives the internal voltage from at least two active internal voltage generating means.

25. The semiconductor memory device in accordance with claim 24, wherein the active control means includes:
   a division signal generating unit receiving the plurality of mode signals and the internal voltage driving signal for producing a plurality of division signals and the supplementary high-voltage driving signal; and
   a driving signal generating unit receiving the plurality of division signals and the plurality of hank driving signals for outputting a corresponding signal of the plurality of active high-voltage driving signals.

26. The semiconductor memory device in accordance with claim 25, wherein the division signal generating unit includes:
   a first NAND gate for NANDing the low mode signal and the high voltage driving signal;
   a first inverter for inverting an output signal of the first NAND gate and for outputting to the high supplementary voltage driving signal;
   a first switch for delivering the high voltage driving signal as the first division signal;
   a second inverter for inverting the high mode signal;
   a second NAND gate for NANDing an output signal of the second inverter and the high voltage driving signal; and
   a third inverter for inverting an output signal of the second NAND gate and for outputting the inverted signal as the second division signal.

27. A method for driving a semiconductor memory device comprising the steps of:
   supplying an internal voltage based on a reference voltage;
   supplying a test internal voltage based on the reference voltage; and
   detecting a voltage level of the internal voltage based on the test internal voltage and controlling an amount of the internal voltage to be supplied when the internal voltage descends below the reference voltage, wherein the test internal voltage is supplied only in a step of identifying a modes,
   wherein the step of controlling the amount of the internal voltage includes:
   detecting a voltage level of the internal voltage based on the test internal voltage and identifying first to third modes using the detected voltage level; and
   increasing the amount of the internal voltage in the first mode, maintaining the amount of the internal voltage in the second mode and decreasing the amount of the internal voltage in the third mode.

28. The method for driving the semiconductor memory device in accordance with claim 27, wherein the voltage level of the internal voltage is lower than that of the test internal voltage in the first mode, wherein the voltage level of the internal voltage is the same as that of the test internal voltage in the second mode, and wherein the voltage level of the internal voltage is higher than that of the test internal voltage in the third mode.

29. A method for driving a semiconductor memory device comprising the steps of:
- supplying an internal voltage based on a reference voltage using an external voltage as a power source; and
- detecting a voltage level of the internal voltage based on the external voltage and controlling the amount of the internal voltage to be supplied,
- wherein the step of controlling the amount of the internal voltage includes:
- detecting a voltage level of the internal voltage based on the external voltage and identifying first to third modes using the detected voltage level; and
- increasing the amount of the internal voltage in the first mode, maintaining the amount of the internal voltage in the second mode and decreasing the amount of the internal voltage in the third mode,
- wherein the voltage level of the external voltage is lower than that of the test internal voltage in the first mode, wherein the voltage level of the internal voltage is the same as that of the test internal voltage in the second mode, and wherein the voltage level of the internal voltage is higher than that of the test internal voltage in the third mode.

30. A semiconductor memory device, comprising:
- a plurality of active internal voltage generating means for supplying an internal voltage in an active mode, wherein the active internal voltage generating means is driven by one of a plurality of active high voltage driving signals;
- a supplementary active internal voltage generating means for additionally supplying a supplementary internal voltage when an amount of an external voltage is not sufficient in the active mode;
- an active control means for selectively controlling the plurality of active internal voltage generating means and the supplementary active internal voltage generating means in response to a plurality of mode signals and an internal voltage driving signals;
- a mode detecting means for detecting the level of the internal voltage based on a test internal voltage and producing a plurality of mode signals;
- a standby internal voltage generating means for supplying an standby internal voltage in response to the internal voltage driving signal in a standby mode; and
- a level detecting means for detecting a level of the internal voltage based on a reference voltage and for producing an internal voltage driving signal.

31. The semiconductor memory device in accordance with claim 30, further comprising:
- a test internal voltage supply means for generating the test internal voltage based on the reference voltage.

* * * * *